United States Patent [19]

Kanai et al.

[11] Patent Number: 4,599,521

[45] Date of Patent: Jul. 8, 1986

[54] BIAS CIRCUIT WITH VOLTAGE AND TEMPERATURE COMPENSATION FOR AN EMITTER COUPLED LOGIC CIRCUIT

[75] Inventors: Yasunori Kanai, Inagi; Eiji Sugiyama; Kazumasa Nawata, both of Kawasaki, all of Japan

[73] Assignee: Fujitsu Limited, Kawasaki, Japan

[21] Appl. No.: 453,113

[22] Filed: Dec. 27, 1982

[30] Foreign Application Priority Data

Dec. 29, 1981 [JP] Japan ................. 56-214807

[51] Int. Cl.[4] ................. H03K 19/003; H03K 19/086; H03K 19/092; H03K 19/098
[52] U.S. Cl. ................. 307/455; 307/475; 307/297; 307/310
[58] Field of Search ................. 307/443, 200 A, 445, 307/455, 467, 475, 270, 296 R, 297, 310

[56] References Cited

U.S. PATENT DOCUMENTS

| | | | |
|---|---|---|---|
| 3,508,076 | 4/1967 | Winder | 307/455 X |
| 3,560,770 | 2/1971 | Gieles | 307/455 |
| 3,970,876 | 7/1976 | Allen et al. | 307/455 X |
| 4,249,091 | 2/1981 | Yamagiwa | 307/455 |
| 4,329,597 | 5/1982 | Yamagiwa | 307/455 |

*Primary Examiner*—Stanley D. Miller
*Assistant Examiner*—David R. Bertelson
*Attorney, Agent, or Firm*—Staas & Halsey

[57] ABSTRACT

A bias circuit for providing a reference voltage to an output circuit, for example, an ECL circuit in an LSI. The bias circuit is able to operate at a lower power supply voltage of about −2 V and includes a first transistor having an emitter which is connected to a power supply and a base and a collector commonly connected through an impedance circuit to ground. The bias circuit is also connected to the output circuit, whereby heat generation in the LSI is decreased.

8 Claims, 5 Drawing Figures

BIAS CIRCUIT WITH VOLTAGE AND TEMPERATURE COMPENSATION FOR AN EMITTER COUPLED LOGIC CIRCUIT

BACKGROUND OF THE INVENTION

1. Field of the Invention

The present invention relates to a bias circuit. More particularly, it relates to a bias circuit for an emitter coupled logic (ECL) circuit in a large scale integrated circuit (LSI) which can be driven at a relatively low power-supply voltage for the purpose of suppressing heat generation therein.

Generally, in bipolar-type logic circuits such as ECL circuits, the delay time for one logic circuit stage depends largely on the amount of current flowing through the circuit. That is, the delay time in each circuit is inversely proportional to the amount of current flowing therethrough as long as the parasitic capacitances in the circuit, the wiring capacitances of the wires for connecting elements in the circuit, the switching capability of each transistor in the circuit, and the ratio of currents delivered to various elements in the circuit, are constant. In other words, the greater the current supplied to the circuit, the higher the switching speed. Because of this, when trying to decrease the power consumption of integrated circuits, it is better to lower the power supply voltage rather than the current. Reduction of the power consumption of integrated circuits is necessary from the viewpoint of decreasing the amount of heat generated in the circuits, which is one of the factors limiting the degree of integration. The more power consumption in a circuit, the more heat is generated. The power consumption in each gate is especially great in conventional bipolar-type integrated circuits.

Two power supplies are generally used for an ECL integrated circuit, i.e., a power supply for providing a voltage of $-5.2$ V through $-4.5$ V to the circuit and a power supply for providing a voltage of $-2$ V as a terminating voltage at the ends of signal lines. The bias circuit according to the present invention aims to be operated at the voltage of $-2$ V which is regularly used for the termination of signal lines in ECL circuit systems.

2. Description of the Prior Art

FIG. 1 is a diagram of a conventional bias circuit and a conventional ECL circuit to which a bias voltage is applied. In the figure, the ECL circuit $ECL_0$ consists of input transistors $T_1$ and $T_2$, a reference transistor $T_3$, a transistor $T_4$ functioning as a constant current source, an output transistor $T_5$ for outputting a logical NOR output $\bar{X}_0$, an output transistor $T_6$ for outputting a logical OR output $X_0$, load resistors $R_1$ and $R_2$, and resistors $R_3$, $R_4$, and $R_5$, for current feedback, connected to the emitters of the transistors $T_4$, $T_5$, and $T_6$, respectively. To the base of the reference transistor $T_3$, a first bias voltage $V_{BB0}$, output from a bias circuit $BC_0$, is applied. To the base of the transistor $T_4$, a second bias voltage $V_{CS0}$, output from the bias circuit $BC_0$, is applied.

The bias circuit $BC_0$ consists of resistors $R_6$ and $R_7$ diodes $D_1$ and $D_2$, and a resistor $R_8$ connected in series between a first power supply terminal $V_{CC}$ and a second power supply terminal $V_{EE0}$. The bias circuit $BC_0$ also consists of transistor $T_7$ and $T_8$ and a resistor $R_9$ connected in series between the first power supply terminal $V_{CC}$ and the second power supply terminal $V_{EE0}$. The base of the transistor $T_7$ is connected to a connecting point between the resistors $R_6$ and $R_7$. The base of the transistor $T_8$ is connected to a connecting point between the resistor $R_7$ and the diode $D_1$.

The first bias voltage $V_{BB0}$ is determined by the base-emitter voltage $V_{BET}$ of the transistor $T_7$, which is about 0.8 V, and the voltage drop across the resistor $R_6$, which is, for example 0.5 V. Therefore, the voltage $V_{BB0}$ is about $-1.3$ V. The bias voltage $V_{BB0}$ is higher than a low level (L level) of, for example, $-1.7$ V and lower than a high level (H level) of, for example, $-0.9$ V.

The operation of the ECL circuit $ECL_0$ is well known. In brief, when at least one of the inputs $A_0$ and $B_0$ is at the H level, the transistor $T_1$ or $T_2$ is on, or both transistors $T_1$ and $T_2$ are on, and the transistor $T_3$ is off, resulting, at the NOR output $\bar{X}_0$, in the L level of about $-1.7$ V, which is determined by the voltage drop (0.9 V) across the resistor $R_1$ and the base-emitter voltage (0.9 V) of the transistor $T_5$. At the OR output $X_0$, the H level of about $-0.9$ V results which is determined by the base-emitter voltage (0.8 V) of the transistor $T_6$ and the voltage drop (0.1 V) across the resistor $R_2$. The L level voltage at the output $\bar{X}_0$ or $X_0$ is partially determined by the ratio of the resistors $R_1$ and $R_3$. When both of the inputs $A_0$ and $B_0$ are at the L level, the transistors $T_1$ and $T_2$ are both off, and the transistor $T_3$ is on, resulting in the H level at the NOR output $\bar{X}_0$ and resulting in the L level at the OR output $X_0$.

Generally, in an ECL circuit, the first power supply voltage (also referred to as $V_{CC}$) is 0 V, and the second power supply voltage (also referred to as $V_{EE1}$) is a negative voltage. In order to suppress the generation of heat in the ECL circuit, it is desirable to limit the voltage difference between $V_{CC}$ and $V_{EE0}$ as much as possible. However, when the conventional bias circuit $BC_0$ is employed, the minimum voltage difference between $V_{CC}$ and $V_{EE0}$ for reliable operation is about 3 V, as explained in the following. That is, the voltage difference between $V_{CC}$ and $V_{EE0}$ is determined by the sum of the voltage drops across the resistor $R_6$, the base-emitter voltage of the transistor $T_7$, the base-collector voltage of the transistor $T_8$, the forward bias voltages across the diodes $D_1$ and $D_2$, and the voltage drop across the resistor $R_8$. The maximum collector-base voltage of the transistor $T_8$, for keeping its collector-base junction in a reverse bias state in order to prevent the transistor $T_8$ from being operated in a saturation region, is 0 V. The base-emitter voltage of each transistor and the forward bias voltage of each diode, when manufactured of silicon, are both about 0.8 V. Therefore, the voltage difference between $V_{CC}$ and $V_{EE0}$ should be at least 2.4 V. In order to attain stable operation, the voltage drops across the resistors $R_6$ and $R_8$ should be, for example, about 0.2 V and 0.4 V, respectively. As a result, the above-mentioned sum is about 3 V. Therefore, the second power supply $V_{EE0}$ should be lower than $-3$ V. The absolute value of this voltage is too great for increased integration in an integrated circuit.

In the conventional circuit of FIG. 1, if the second power supply voltage $V_{EE0}$ is $-2$ V, the base-emitter voltage of the transistor $T_7$ and the forward bias voltage of the diodes $D_1$ and $D_2$ would become insufficient, thereby preventing operation of the bias circuit $BC_0$.

SUMMARY OF THE INVENTION

It is, therefore, an object of the present invention to provide a bias circuit which can stably operate at a low power supply voltage without deteriorating the switching speed.

Another object of the present invention is to suppress the generation of heat in an integrated circuit.

Still another object of the present invention is to decrease the power consumption in an integrated circuit.

A still further object of the present invention is to increase the degree of integration in an integrated circuit.

In order to attain the above objects, there is provided a bias circuit for providing a bias voltage to an output means comprising: a first transistor having an emitter, a base, and a collector, the base and the collector being connected to each other; a first reference-voltage terminal for providing a first reference voltage connected to the emitter; a substantially constant-voltage node; an output node connected to the base and the collector of the first transistor, for providing the bias voltage; and a first impedance means connected between the constant-voltage node and the output node; the bias voltage being applied to the output means connected to the output node.

BRIEF DESCRIPTION OF THE DRAWINGS

The above objects and advantages as well as other features of the present invention will be better understood from the following description of preferred embodiments with reference to the accompanying drawings, in which.

DESCRIPTION OF THE PREFERRED EMBODIMENTS

Figure 1:
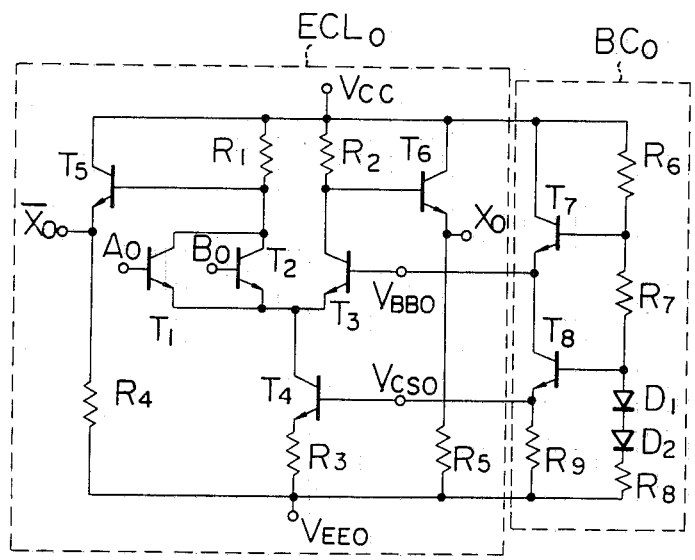
FIG. 1 is a diagram of a conventional bias circuit and a conventional ECL circuit to which a bias voltage is applied.
Figure 2:
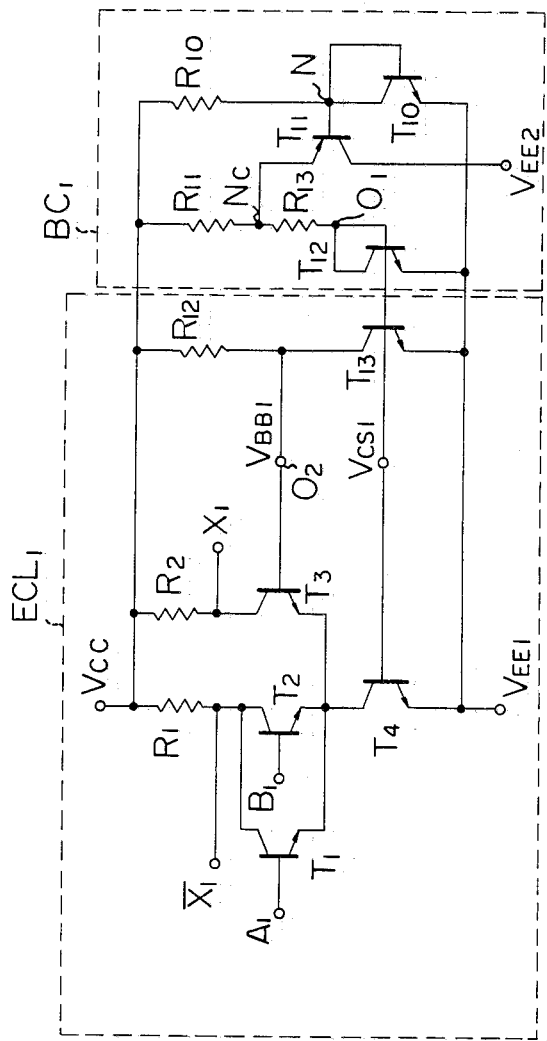
FIG. 2 is a diagram of a bias circuit and an ECL circuit to which a bias voltage is applied, according to a first embodiment of the present invention.

FIG. 2 is a circuit diagram of a first embodiment of the present invention. In the figure, an ECL circuit $ECL_1$ is similar to the circuit $ECL_0$ of FIG. 1 except that the ECL circuit $ECL_1$ in FIG. 2 does not include the emitter follower output transistors $T_5$ and $T_6$, or the resistors $R_3$, $R_4$, and $R_5$. A bias circuit $BC_1$ in FIG. 2, however, is greatly different from the conventional bias circuit $BC_0$ in FIG. 1. The bias circuit $BC_1$ comprises an NPN transistor $T_{10}$, a PNP transistor $T_{11}$, NPN transistors $T_{12}$ and $T_{13}$, load resistors $R_{10}$, $R_{11}$, and $R_{12}$, and a resistor $R_{13}$. The resistance value of the load resistor $R_{12}$ is half that of the load resistor $R_1$ or $R_2$. The collector and base of the NPN transistor $T_{10}$ are commonly connected to a node N. Between the node N and first power supply terminal $V_{CC}$, the load resistor $R_{10}$ is connected. The emitter of the transistor $T_{10}$ is connected to a second power supply terminal $V_{EE1}$ to which a power supply voltage of −2 V, which is higher than the conventional power supply voltage of less than −3 V, described later in detail. The PNP transistor $T_{11}$ has a base connected to the node N, an emitter connected through the load resistor $R_{11}$ to the first power supply terminal $V_{CC}$, and a collector connected to a third power supply terminal $V_{EE2}$. The voltage at the third power supply terminal $V_{EE2}$ is equal to or less than the voltage at the second power supply terminal $V_{EE1}$. The emitter of the PNP transistor $T_{11}$ is also connected at a node $N_c$ to one end of the resistor $R_{13}$. The other end of resistor $R_{13}$ is connected to an output node $O_1$ to which the base and the collector of the NPN transistor $T_{12}$ are commonly connected. The emitter of the transistor $T_{12}$ is connected to the second power supply terminal $V_{EE1}$. The transistor $T_{13}$ has a collector connected through the load resistor $R_{12}$ to the first power supply terminal $V_{CC}$, a base connected to the output node $O_1$, and an emitter connected to the second power supply terminal $V_{EE1}$. For the circuit configuration of this bias circuit $BC_1$, the voltage difference between the first power supply voltage, also referred to as $V_{CC}$, and the second power supply voltage, also referred to as $V_{EE1}$, is:

$$V_{CC} - V_{EE1} = V(R_{11}) + V_{EBT11} + V_{BET10},$$

where $V(R_{11})$ is the voltage drop across the resistor $R_{11}$; $V_{EBT11}$ is the emitter-base forward voltage of the PNP transistor $T_{11}$; and $V_{BET10}$ is the base-emitter forward voltage of the NPN transistor $T_{10}$. $V_{EBT11}$ and $V_{BET10}$ are both about 0.8 V. Since the second power supply voltage $V_{EE1}$ is −2 V and the first power supply voltage is 0 V, the voltage drop $V(R_{11})$ becomes about 0.4 V. Thus, the voltage difference between the first power supply voltage $V_{CC}$ and the second power supply voltage $V_{EE1}$ can be made as small as 2 V.

Even when the power supply voltage is low, as mentioned above, the ECL circuit $ECL_1$ can effect stable operation. First, the emitter currents of the transistors $T_{12}$, $T_{13}$ and $T_4$ are same because the base-emitter voltage characteristics of these transistors are the same when these transistors are manufactured during the same manufacturing process. The emitter current of the transistor $T_{12}$ is equal to the current $i(R_{13})$ flowing through the resistor $R_{13}$. The base-emitter voltage $V_{BET12}$ of the transistor $T_{12}$ is equal to the base-emitter voltage $V_{BET10}$ of the transistor $T_{10}$. Therefore, the potential at the output node $O_1$ is equal to the potential at the node N. Accordingly, the voltage $V(R_{13})$ across the resistor $R_{13}$ is equal to the emitter-base voltage $V_{EBT11}$ of the PNP transistor $T_{11}$. Thus, the following expressions can be substantially obtained.

$$i(R_{13}) = V(R_{13})/R_{13} = V_{EBT11}/R_{13}$$

Since $i(R_{13})$ is nearly equal to the emitter current of the transistor $T_4$ or to the emitter current of the transistor $T_{13}$, the current flowing through the transistor $T_4$ or $T_{13}$ is substantially equal to $V_{EBT11}/R_{13}$, which is independent from the power supply voltage $V_{EE1}$. In other words, the node $N_c$ functions as a substantially constant-voltage node due to the constant voltage characteristics of the forward biased PN junction and enables establishment of a desired constant current $i(R_{13})$ through the resistor 13. Therefore, even when the power supply voltage fluctuates, the current through the transistor $T_4$ or $T_{13}$ is constant.

Second, in operation, when at least one of the inputs $A_1$ and $B_1$ is at the H level, i.e., 0 V, the transistor $T_1$ or $T_2$, or both transistors $T_1$ and $T_2$, are on, so that the above-mentioned current $V_{EBT11}/R_{13}$ flows through the resistor $R_1$, resulting in an L level at the NOR output $\overline{X}_1$. The L level voltage $V_{OL\overline{X}_1}$ at the NOR output $\overline{X}_1$ is:

$$V_{OL\overline{X}_1} = -R_1 \cdot V_{BET_{11}}/R_{13}$$

When the NOR output $\overline{X}_1$ is at the L level, the transistor $T_3$ is off and the OR output $X_1$ is at an H level of 0 V.

When both inputs $A_1$ and $B_1$ are at the L level, the NOR output $X_1$ is at the H level of 0 V and the OR output $X_1$ is at the L level of $-R_2 V_{BET_{11}}/R_{13}$.

The reference voltage $V_{BB1}$ applied to the base of the transistor $T_3$ is expressed as:

$$V_{BB1} = -R_{12} \cdot V_{EBT_{11}}/R_{13}.$$

As mentioned before, since $R_{12} = \frac{1}{2}R_1 = \frac{1}{2}R_2$, the reference voltage $V_{BB1}$ is:

$$V_{BB1} = \frac{1}{2}R_1 \cdot V_{EBT_{11}}/R_{13}$$
$$= \frac{1}{2}V_{OL\overline{X}_1}$$
$$= \frac{1}{2}V_{OLX_1}.$$

Thus, the reference voltage $V_{BB1}$ is half of the L level of the NOR output $\overline{X}_1$ or the OR output $X_1$. This means a maximum noise margin for the H level and the L level with respect to the reference voltage $V_{BB1}$.

Third, even when the temperature of the integrated circuit including the ECL circuit $ECL_1$ is increased, the transistors $T_1$, $T_2$, or $T_3$ are substantially prevented from being saturated. That is, when the temperature is increased, the base-collector voltage of an NPN transistor is generally decreased, so that the transistor tends to enter a saturated state. However, in the circuit of FIG. 2, the base-collector voltage of, for example, the transistor $T_1$ is $-R_1V_{EBT_{11}}/R_{13}$ when it is in an on state. The emitter-base voltage $V_{EBT_{11}}$ of the PNP transistor $T_{11}$ is also decreased along with the increase of the temperature, because the emitter-base characteristic of the PNP transistor $T_{11}$ is similar to the base-collector characteristic of the NPN transistor $T_1$. Therefore, when the temperature is increased, not only the base-emitter voltage of the transistor $T_1$, but also the base-collector voltage of the transistor $T_1$ is decreased. Thus, the transistor $T_1$ is substantially prevented from being saturated even when the temperature is increased. A similar discussion can be applied to the transistors $T_2$ and $T_3$.

Figure 3:
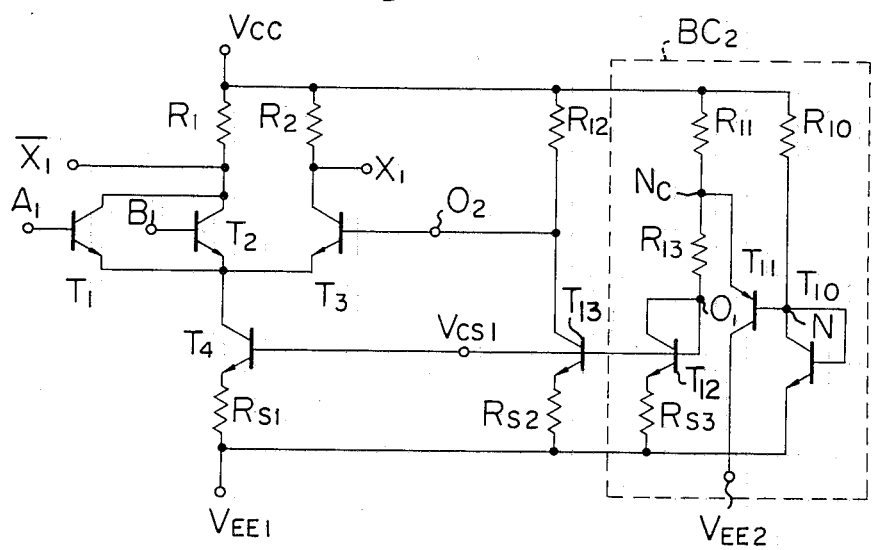
FIG. 3 is a circuit diagram of a second embodiment of the present invention.

FIG. 3 is a circuit diagram of a second embodiment of the present invention. The difference between FIGS. 2 and 3 is that, in FIG. 3, resistors $R_{S1}$, $R_{S2}$, and $R_{S3}$, having small resistances, are connected between the emitter of the transistor $T_4$ and the second power supply terminal $V_{EE1}$, between the emitter of the transistor $T_{13}$ and the second power supply terminal $V_{EE1}$, and between the emitter of the transistor $T_{12}$ and the power supply terminal $V_{EE1}$. Except for the above resistors $R_{S3}$, $R_{S2}$, and $R_{S1}$, the circuit configuration of FIG. 3 is the same as that of FIG. 2, and, therefore, a detailed explanation is omitted here. These small resistances function as current feedback devices. More precisely, even when the base-emitter voltages of the transistors $T_4$, $T_{13}$, and $T_{12}$ are made different due to the manufacturing process, the collector currents of these transistors can be made nearly equal to each other by providing the small resistances $R_{S1}$, $R_{S2}$, and $R_{S3}$. That is, these resistors are provided for decreasing current hoggings by the transistors. In a practical circuit design, the small resistances may be provided. It should be noted that the output level does not substantially depend on the small resistances, i.e., the L level of the output $\overline{X}_1$ or $X_1$ is also expressed as $-R_1 V_{EBT}/R_{13}$. It is preferable to design the L level in the range between $-200$ mV and $-450$ mV.

Figure 4:
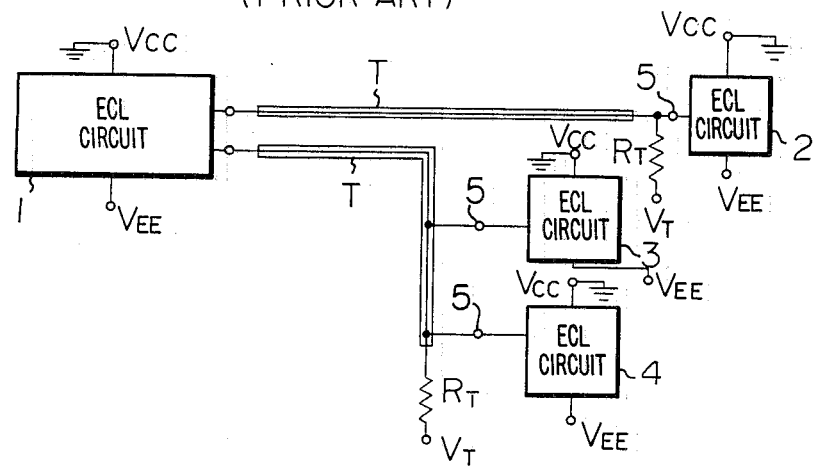
FIG. 4 is a block diagram of an example of a system employing conventional ECL circuits.

FIG. 4 is a block diagram of an example of a system including ECL integrated circuits. In FIG. 4, reference numerals 1 through 4 are ECL integrated circuits. Each ECL integrated circuit is conventionally driven by a power supply voltage in the range of $-5.2$ V through $-4.5$ V. The ECL circuits are connected by transmission lines T to each other. Each of the transmission lines T is connected to an end terminal 5. To each end terminal 5, an end terminal power supply voltage $V_T$ is usually applied through a resistor $R_T$ having the same impedance as the impedance of each transmission line T. The purpose of applying the end terminal power supply voltage $V_T$ through a resistor $R_T$ is to prevent signals from reflecting back to the transmission line T. This end terminal power supply voltage is usually $-2.0$ V. In the embodiments of the present invention described above, this end terminal power supply voltage is used as the second power supply voltage $V_{EE1}$ without providing a particular power supply unit for providing such a low power supply voltage.

Figure 5:
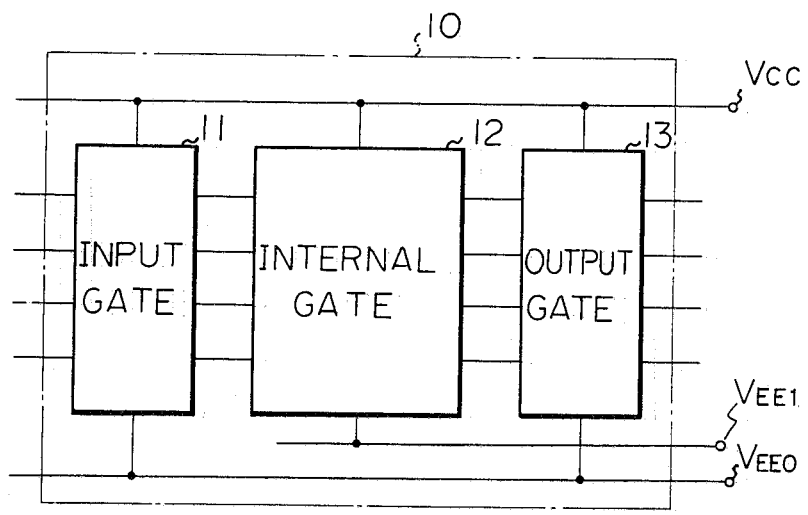
FIG. 5 is a block diagram of an ECL large-scale integrated circuit to which the present invention is effectively applied.

FIG. 5 is a block diagram of an ECL large-scale integrated circuit (LSI) 10. In the figure, the ECL-LSI 10 includes an input gate 11, an internal gate 12, and an output gate 13. All of these gates are connected to the first power supply terminal $V_{cc}$ to which a voltage of 0 V is applied. The input gate 11 and the output gate 13 are driven by the power supply voltage of $V_{EE0}$ in the range between $-5.2$ V and $-4.5$ V because, in these gates 11 and 13, the H level is about $-0.9$ V and the L level is about $-1.7$ V, and therefore, the logical amplitude is about 800 mV. This value of amplitude is necessary for connecting the ECL LSI 10 to another ECL circuit (not shown). In the internal gate 12, however, the logical amplitude can be made as small as 400 mV by employing the second power supply voltage $V_{EE1}$ of $-2.0$ V. The interface between the input gate 11 and the internal gate 12 or between the internal gate 12 and the output gate 13 can be easily made. Accordingly, the bias circuit illustrated in FIG. 2 or 3 according to the embodiment of the present invention is effectively included in the internal gate 12, because, as mentioned before, the L level of the ECL circuit connected to the bias circuit of the present invention is preferably selected to be in the range between $-200$ mV and $-450$ mV.

From the foregoing description, it will be apparent that, according to the present invention, an improved bias circuit can be obtained which can be stably driven by a low absolute value of a power supply voltage without deteriorating the switching speed, whereby generation of heat in an integrated circuit can be considerably suppressed.

The present invention is not restricted to the above-mentioned embodiments. Various modifications are possible. For example, in place of the ECL circuit, any output means may be provided with the bias voltage produced by the bias circuit of the present invention.

We claim:
1. A bias circuit, operatively connected to a power supply, for providing a bias voltage to an output means, comprising:

a first transistor of a first conductivity type having an emitter, a base, and a collector operatively connected to the base;
a first reference-voltage terminal, operatively connected to the emitter of said first transistor, for providing a first reference-voltage;
a substantially constant-voltage node;
an output node, operatively connected to the base and collector of said first transistor and to the output means, for providing the bias voltage;
first impedance means, operatively connected between said substantially constant-voltage node and said output node, for providing a first impedance, the bias voltage being applied to the output means;
second impedance means, operatively connected between said first reference-voltage terminal and said substantially constant-voltage node;
a second transistor having a base, having a collector connected to the base and having an emitter operatively connected to said first reference-voltage terminal;
a PN junction element including a third transistor of a second conductivity type opposite to the first conductivity type, said third transistor having an emitter operatively connected to said substantially constant-voltage node, having a base operatively connected to the base and collector of said second transistor, and having a collector, the voltage at said substantially constant-voltage node being determined by said PN junction element and said second transistor; and
a second reference-voltage terminal operatively connected to the collector of said third transistor.

2. A bias circuit as set forth in claim 1, wherein said second reference-voltage terminal provides a second reference-voltage equal to the first voltage.

3. A bias circuit as set forth in claim 1, wherein said second reference-voltage terminal provides a second reference-voltage which is lower than the first reference-voltage.

4. A bias circuit, operatively connected to a power supply, for providing a bias voltage to an output means, comprising:
a first transistor of a first conductivity type, having an emitter, having a base, and having a collector operatively connected to the base;
a first reference-voltage terminal, operatively connected to the emitter of said first transistor, for providing a first reference-voltage;
a second reference-voltage terminal for providing a second reference-voltage;
a substantially constant-voltage node;
an output node, operatively connected to the base and collector of said first transistor and to the output means, for providing the bias voltage;
first impedance means, operatively connected between said substantially constant-voltage node and said output node, for providing a first impedance means, the bias voltage being applied to the output means;
second impedance means operatively connected between said first reference-voltage terminal and said substantially constant-voltage node;
a second transistor of a second conductivity type opposite to the first conductivity type, having an emitter operatively connected to said substantially constant-voltage node, having a base, and having a collector operatively connected to said second reference-voltage terminal; and
a third transistor having a base and a collector commonly connected to said base of said second transistor, and having an emitter operatively connected to said first reference-voltage terminal, the voltage at said substantially constant-voltage node being determined by said second transistor and said third transistor.

5. A bias circuit as set forth in claim 4, wherein said second reference-voltage terminal provides a second reference-voltage which is lower than the first reference-voltage.

6. A bias circuit as set forth in claim 1, wherein said first transistor is of a first conductivity type, and wherein said PN junction element comprises a third transistor of a second conductivity type opposite to the first conductivity type, said third transistor having an emitter operatively connected to said substantially constant-voltage node, having a base operatively connected to the base and collector of said second transistor, and having a collector.

7. A bias circuit as set forth in claim 6, further comprising a second reference-voltage terminal, wherein the collector of said third transistor is operatively connected to said second reference-voltage terminal.

8. A bias circuit as set forth in claim 6, further comprising a second reference-voltage terminal, operatively connected to the collector of said third transistor, for providing a second reference-voltage lower than the first reference-voltage.

* * * * *